(12) United States Patent
Huang

(10) Patent No.: US 7,411,790 B2
(45) Date of Patent: Aug. 12, 2008

(54) HEAT SINK WITH BUILT-IN HEAT PIPES FOR SEMICONDUCTOR PACKAGES

(75) Inventor: Hong-Yuan Huang, Fengshan (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/019,279

(22) Filed: Dec. 23, 2004

(65) Prior Publication Data

US 2005/0201060 A1    Sep. 15, 2005

(30) Foreign Application Priority Data

Dec. 26, 2003    (CN) .................................. 92222808

(51) Int. Cl.
*H05K 7/20* (2006.01)
(52) U.S. Cl. .................. 361/700; 361/702; 361/710; 165/104.33; 257/707; 257/715
(58) Field of Classification Search .............. 361/687, 361/700, 702, 710, 697–699, 704–709, 714, 361/719; 257/675, 796, 706–727; 174/15.2, 174/16.3, 252; 165/80.3, 185, 104.32, 104.33, 165/121–127, 260, 104.26; 29/890.03, 890.035, 29/890.032, 827
See application file for complete search history.

(56) References Cited

U.S. PATENT DOCUMENTS 4,880,052 A  * 11/1989  Meyer et al. ........... 165/104.14
5,697,428 A  * 12/1997  Akachi ................... 165/104.21
5,880,524 A  *  3/1999  Xie ............................. 257/704
6,133,631 A  * 10/2000  Belady ....................... 257/714
6,237,223 B1 *  5/2001  McCullough .......... 29/890.032
6,321,452 B1 * 11/2001  Lin ......................... 29/890.032
6,666,260 B2 * 12/2003  Tantoush ................... 165/80.3
2005/0022984 A1 *  2/2005  Rosenfeld et al. ........... 165/260

FOREIGN PATENT DOCUMENTS

JP     02001168255 A  *  6/2001
TW         501792         9/2002

* cited by examiner

*Primary Examiner*—Michael Datskovskiy
(74) *Attorney, Agent, or Firm*—Troxell Law Office, PLLC

(57) ABSTRACT

A heat sink with a built-in heat pipe for semiconductor package is disclosed. At least a built-in heat pipe is disposed in a cavity of a metal vessel and sealed by a metal cover. The built-in heat pipe has an evaporating portion, a condensing portion, and a bent portion between the evaporating portion and the condensing portion. Thermal interface materials are applied in the cavity such that the evaporating portion is thermally coupled to the metal vessel, and the condensing portion is thermally coupled to the metal cover. The metal vessel has a flat surface opposing to the cavity for attaching to a heating surface of a semiconductor package.

22 Claims, 2 Drawing Sheets

HEAT SINK WITH BUILT-IN HEAT PIPES FOR SEMICONDUCTOR PACKAGES

FIELD OF THE INVENTION

The present invention relates to a heat sink for semiconductor packages, more particularly to a heat sink with built-in heat pipes for semiconductor packages.

BACKGROUND OF THE INVENTION

A new approach for cooling electronic devices is to utilize heat pipes to perform better heat dissipation. Cooling using heat pipes is quiet and efficient, heat pipes can be assembled in electronic devices with various configurations, such as connected to a printed circuit board in a notebook computer or portable electronics. Conventionally the printed circuit board should reserve enough space for disposing the heat pipe, and one ends of heat pipes can be connected to a semiconductor package or heating component.

A conventional electronic device using a heat pipe is disclosed in R.O.C. Taiwan Patent No. 501,792. One end (evaporating end) of a heat pipe is embedded inside a molding compound of a semiconductor package and is adjacent to a chip. The other end (condensing end) of the heat pipe is extended outside of the molding compound. However, there is no protection for the heat pipe for this package. The exposed end of the heat pipe can be easily damaged. Another problem is that it is difficult to partially embed one end of the heat pipe in the molding compound.

In another known technique, a heat pipe is assembled with a fin-type heat sink used for semiconductor packages. Normally the heat pipe is bent in U-shaped and crosses the fins of the heat sink. The bent portion of the heat pipe is exposed to the outside and protrudes from one side of the heat sink, resulting in higher risk of damages by collision.

SUMMARY

The primary object of the present invention is to provide a heat sink with built-in heat pipe and an electronic device including a semiconductor package and the heat pipe. At least a built-in heat pipe is disposed in a cavity of a metal vessel and sealed by a metal cover. The evaporating portion, the condensing portion, and the bent portion of the built-in heat pipe are not to expose to the outside for a better protection. Also, the evaporating portion is thermally coupled to the metal vessel, and the condensing portion is thermally coupled to the metal cover by thermal interface material for improving heat dissipation.

The secondary object of the present invention is to provide a heat sink with built-in heat pipe for semiconductor packages. A metal vessel has a cavity for accommodating at least a heat pipe, and a flat surface opposing to the cavity. The flat surface has a predetermined dimension corresponding to a heating surface of a semiconductor package for attaching the heating surface. Preferably, the flat surface is a rectangle having the length of the two longer sides between 27 mm and 45 mm to improve heat dissipation of the semiconductor package.

The third object of the present invention is to provide a heat sink with a plurality of built-in heat pipes in parallel. A plurality of parallel grooves are formed on the metal vessel or the metal cover to increase thermal-coupling area with the heat pipes so as to improve heat dissipation property of the built-in heat pipes.

The heat sink with built-in heat pipe for semiconductor package in accordance with the present invention, mainly comprises a metal vessel, at least a built-in heat pipe and a metal cover. The metal vessel has a cavity and a flat surface opposing to the cavity. The built-in heat pipe has a hollow space filled with fluid, and has an evaporating portion, a bent portion and a condensing portion. The built-in heat pipe is disposed in the cavity of the metal vessel. The metal cover is connected to the metal vessel to seal the built-in heat pipe. The evaporating portion of the heat pipe is thermally coupled to the metal vessel by the first thermal interface material, etc. The condensing portion is thermally coupled to the metal cover by the second thermal interface material, etc. Preferably, the metal vessel or the metal cover has at least a groove for increasing the thermal-coupling area with the built-in heat pipe.

DETAILED DESCRIPTION OF THE PRESENT INVENTION

Figure 1:
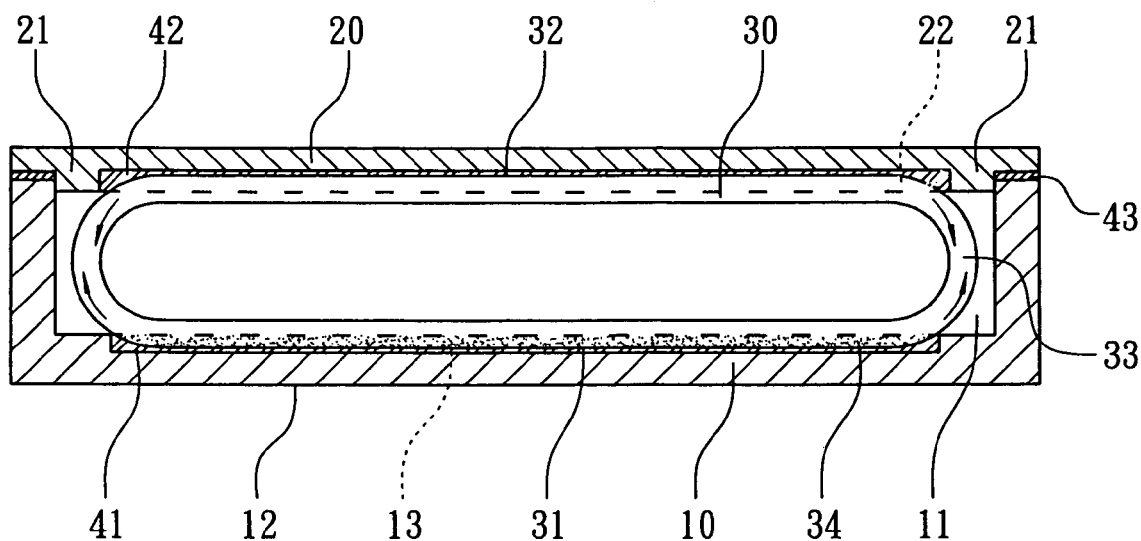
FIG. 1 is a cross sectional view illustrating a heat sink with built-in heat pipe for semiconductor package in accordance with an embodiment of the present invention.

Referring to the drawings attached, the present invention is described by means of the embodiment(s) below.

Figure 3:
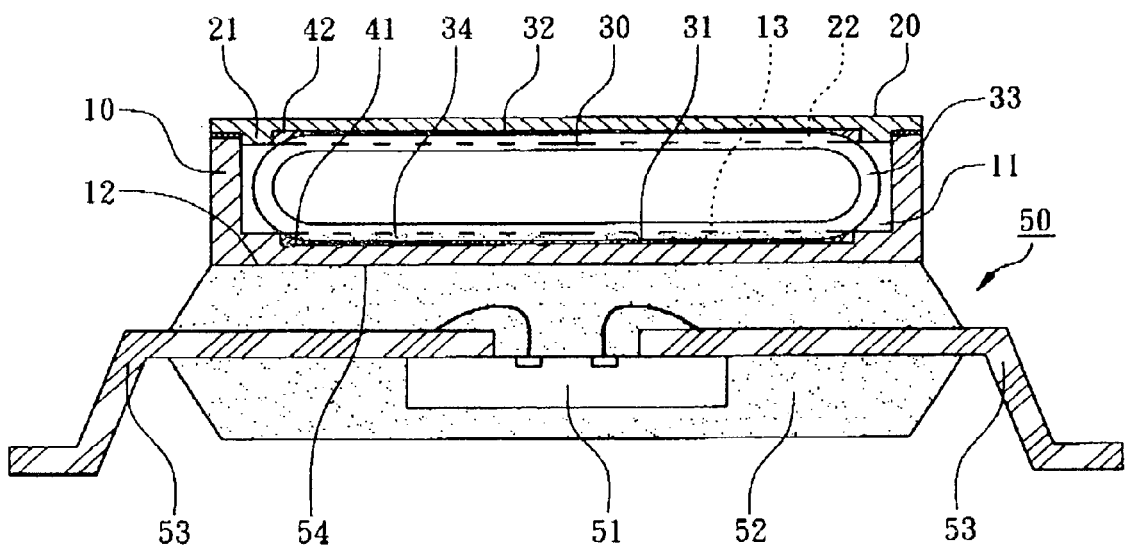
FIG. 3 is a cross sectional view illustrating an electronic device using the heat sink on a TSOP package.
Figure 4:
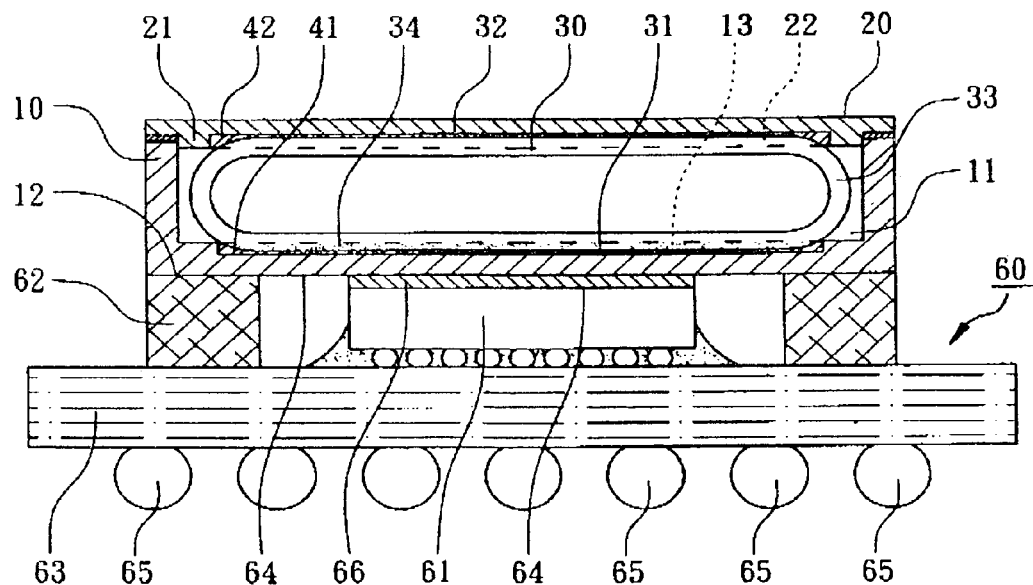
FIG. 4 is a cross sectional view illustrating an electronic device using the heat sink on a BGA package.

FIG. 1 shows a heat sink with built-in heat pipe for semiconductor packages according to an embodiment of the present invention. The heat sink mainly comprises a metal vessel 10, a metal cover 20 and a plurality of built-in heat pipes 30. The built-in heat pipes 30 are disposed on the metal vessel 10 and sealed by the metal cover 20. The metal vessel 10 is made of metal with high thermal conductivity, such as copper, etc. The metal vessel 10 has a cavity 11 and a flat surface 12 opposing to the cavity 11 for attaching to the heating surface of a semiconductor package. The flat surface 12 is in a predetermined dimension, may be a rectangle or a square, etc., for matching the heating surface of the semiconductor package (as shown in FIGS. 3 and 4). In this embodiment, the flat surface 12 is a rectangle with the length of the longer sides between 27 mm and 45 mm. Each built-in heat pipe 30 has a tube-shaped hollow space, which is filled with fluid 34, and has proper capillary structure. Moreover, each built-in heat pipe 30 has an evaporating portion 31, a condensing portion 32 and at least a bent portion 33. The fluid 34 has high enthalpy of vaporization, such as water, dichlorodifluoromethane, ammonia, acetone or methyl alcohol. In this embodiment, the built-in heat pipes 30 are bended to be annular or U-shaped in advance prior to disposing in the cavity 11 of the metal vessel 10. The evaporating portion 31 of the built-in heat pipes 30 is used for absorbing heat from the semiconductor package and vaporizing the fluid 34. The evaporating portion 31 is thermally coupled to the metal vessel 10 at bottom of the cavity 11 by the first thermal interface material 41 or the other thermally conductive medium, etc. In this embodiment, the built-in heat pipes 30 are arranged in parallel in the cavity 11. Preferably, the metal vessel 10 has a plurality of first parallel grooves 13 in the cavity 11 corresponding to the built-in heat pipes 30. The first parallel grooves 13 can increase thermal-coupling area with the evaporating portions 31 of the built-in heat pipes 30 and provide a better orientation for the built-in heat pipes 30.

Figure 2:
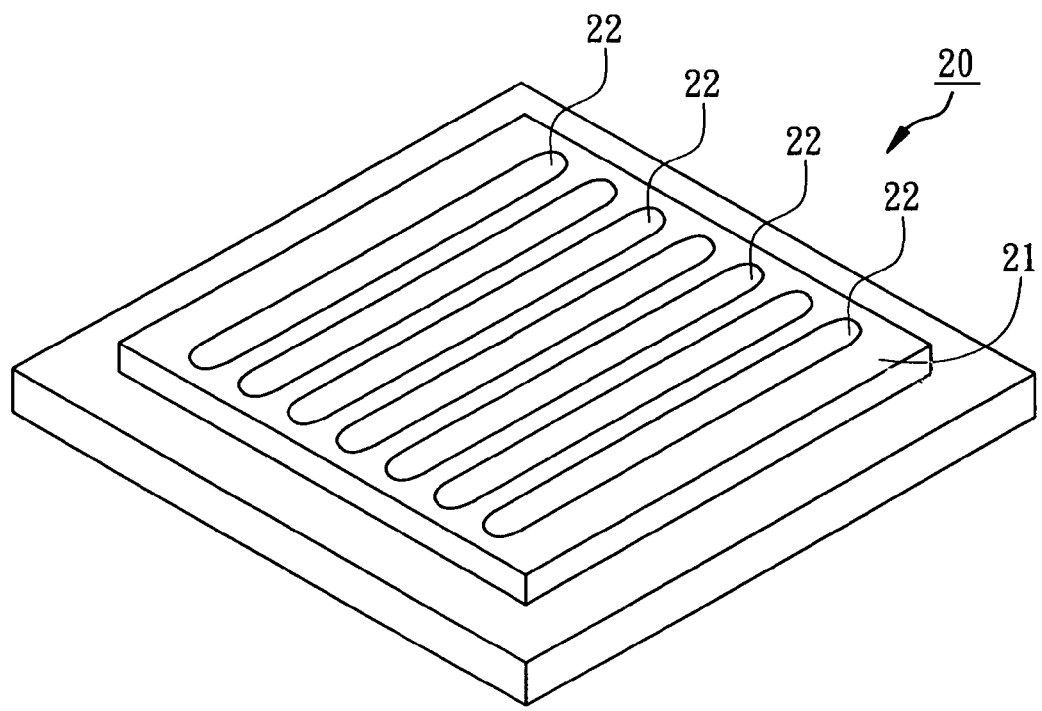
FIG. 2 is a perspective view illustrating the metal cover of the heat sink in accordance with an embodiment of the present invention.

Referring to FIGS. 1 and 2, the metal cover 20 is connected with the metal vessel 10 by epoxy 43 or other adhesive so as to hermetically seal the built-in heat pipes 30 inside the cavity 11. There is a protrusion 21 at the center on the bottom side of the metal cover 20 for aligning the position of the metal cover 20 on the metal vessel 10. After sealing the built-in heat pipes 30, the condensing portion 32 is thermally coupled to the metal cover 20 by the second thermal interface material 42 or the other thermally conductive medium, etc. Thus, all of the built-in heat pipes 30 are not exposed to the outside. Preferably, the metal cover 20 has a plurality of second parallel grooves 22 in the protrusion 21 to increase thermally coupled area with the condensing portions 32 of the built-in heat pipes 30.

Therefore, the heat sink mentioned above is really suitable for heat dissipating a semiconductor package with no risk of damaging the built-in heat pipes 30. The multi-row heat pipes 30 can be hermetically assembled inside the heat sink to perform excellent heat dissipation. Referring to FIG. 3, the heat sink can be attached to a TSOP (Thin Small Outline Package) type semiconductor package 50 to constitute a thermally enhanced electronic device. The semiconductor package 50 mainly includes a chip 51 and a molding compound 52. The chip 51 is attached to a plurality of leads 53 of a leadframe, and then is electrically connected to the plurality of leads 53 by wire bonding. Moreover, the chip 51 is sealed by the molding compound 52. A plurality of leads 53 made from a leadframe extend from the molding compound 51 for electrically connecting the chip 51 to the outside. The semiconductor package 50 has a heating surface 54 near to the chip 51. The heating surface 54 may be formed a top of the molding compound 52. The flat surface 12 of the heat sink is attached to the heating surface 54 of the semiconductor package 50 by adhesion. When the heat generated from the chip 51 is conducted to the heating surface 54 and further conducted to the heat sink through the flat surface 12, then the built-in heat pipes 30 can remove the heat from the metal vessel 10 to the metal cover 20 efficiently and quietly by the thermal coupling between the evaporating portions 31 and the metal vessel 10 and between the condensing portions 32 and the metal cover 20. The fluid 34 is vaporized in the evaporating portion 31. Passing through the bent portion 32, the vaporized fluid 34 can be condensed in the condensing portions 32 of the built-in heat pipes 30 to carry heat to the metal cover 20. Then, the liquidized fluid 34 can flow back to the evaporating portion 31 of the built-in heat pipes 30 along capillary structure of the built-in heat pipes 30. The metal vessel 10 and the metal cover 20 are utilized to protect the built-in heat pipes 30 from collision. The capillary structure of the bent portion 33 is free from the risk of damages. Thus, the plurality of built-in heat pipes 30 may be assembled as a heat sink suitable for semiconductor packages.

The heat sink mentioned above also can be disposed on other different types of semiconductor packages. Referring to FIG. 4, the heat sink is attached to a BGA (Ball Grid Array) type semiconductor package 60. The semiconductor package 60 comprises a chip 61, a stiffener 62 and a substrate 63. The chip 61 is flip-chip attached to on an upper surface of the substrate 63 and enclosed by the stiffener 62. The semiconductor package 60 has a heating surface 64 including a backside of the chip 61. A plurality of solder balls 65 are disposed on the lower surface of the substrate 63. The heat sink with built-in heat pipes 30 is disposed on the semiconductor package 60 by means of attaching the flat surface 12 of the metal vessel 10 of the heat sink to the heating surface 64 of the semiconductor package 60 and the stiffener 62. A thermal interface material 66 may thermally couple the heating surface 64 of the semiconductor package 60 and the flat surface 12 of the metal vessel 10.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A heat sink comprising:
   a metal vessel having a cavity and a flat surface opposing to the cavity;
   at least a heat pipe disposed in the cavity, the heat pipe having an evaporating portion, a condensing portion, and a bent portion formed between the evaporating portion and the condensing portion, and including a fluid therein; and
   a metal cover disposed on the metal vessel for sealing the heat pipe inside the cavity;
   wherein the evaporating portion is thermally coupled to the metal vessel, and the condensing portion is thermally coupled to the metal cover.

2. The heat sink in accordance with claim 1, further comprising a first thermal interface material and a second thermal interface material, wherein the first thermal interface material connects the evaporating portion of the heat pipe with the metal vessel, the second thermal interface material connects the condensing portion of the heat pipe with the metal cover.

3. The heat sink in accordance with claim 1, wherein the heat pipe is annular.

4. The heat sink in accordance with claim 1, wherein the flat surface of the metal vessel is a rectangle or a square.

5. The heat sink in accordance with claim 1, wherein the flat surface of the metal vessel is a rectangle with the length of the long sides between 27 mm and 45 mm.

6. The heat sink in accordance with claim 1, wherein the metal vessel has a first groove in the cavity for increasing thermal-coupling area with the evaporating portion.

7. The heat sink in accordance with claim 1, wherein the metal cover has a second groove on the bottom surface for increasing thermal-coupling area with the condensing portion.

8. The heat sink in accordance with claim 1, further comprising a plurality of heat pipes disposed in the cavity in parallel.

9. The heat sink in accordance with claim 8, wherein the metal vessel has a plurality of first parallel grooves in the cavity for increasing thermal-coupling area with the evaporating portions.

10. The heat sink in accordance with claim 8, wherein the metal cover has a plurality of second parallel grooves on the bottom surface for increasing thermal-coupling area with the condensing portions.

11. The heat sink in accordance with claim 10, wherein the metal cover has a protrusion where the second parallel grooves are formed.

12. An electronic device comprising:
    a semiconductor package including a chip, the semiconductor package having a heating surface; and
    a heat sink disposed on the semiconductor package, including:

a metal vessel having a cavity and a flat surface opposing to the cavity, the flat surface attached to the heating surface of the semiconductor package;

at least a heat pipe disposed in the cavity, the heat pipe having an evaporating portion, a condensing portion, and a bent portion formed between the evaporating portion and the condensing portion, and including a fluid therein; and a metal cover disposed on the metal vessel for sealing the heat pipe inside the cavity;

wherein the evaporating portion of the heat pipe is thermally coupled to the metal vessel, and the condensing portion of the heat pipe is thermally coupled to the metal cover.

13. The electronic device in accordance with claim 12, further comprising a first thermal interface material and a second thermal interface material, wherein the first thermal interface material connects the evaporating portion with the metal vessel, the second thermal interface material connects the condensing portion with the metal cover.

14. The electronic device in accordance with claim 12, wherein the heat pipe is annular.

15. The electronic device in accordance with claim 12, wherein the flat surface of the metal vessel is a rectangle.

16. The electronic device in accordance with claim 12, wherein the flat surface of the metal vessel is a rectangle with the length of the long sides between 27 mm and 45 mm.

17. The electronic device in accordance with claim 12, wherein the metal vessel has a first groove in the cavity for increasing thermal-coupling area with the evaporating portion.

18. The electronic device in accordance with claim 12, wherein the metal cover has a second groove on the bottom surface for increasing thermal-coupling area with the condensing portion.

19. The electronic device in accordance with claim 12, wherein the semiconductor package includes a molding compound, and the heating surface is formed on a top of the molding compound.

20. The electronic device in accordance with claim 12, wherein the heating surface includes a backside of the chip.

21. The electronic device in accordance with claim 12, wherein the semiconductor package is a Thin Small Outline Package (TSOP).

22. The electronic device in accordance with claim 12, wherein the semiconductor package is a Ball Grid Array package (BGA).

* * * * *